(12) United States Patent
Hsu et al.

(10) Patent No.: US 6,614,714 B2
(45) Date of Patent: Sep. 2, 2003

(54) SEMICONDUCTOR MEMORY SYSTEM HAVING A DATA CLOCK SYSTEM FOR RELIABLE HIGH-SPEED DATA TRANSFERS

(75) Inventors: Louis L. Hsu, Fish Kill, NY (US); Jeremy K. Stephens, New Windsor, NY (US); Daniel W. Storaska, Walden, NY (US); Li-Kong Wang, Montvale, NJ (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 10/055,149

(22) Filed: Jan. 22, 2002

(65) Prior Publication Data

US 2003/0137893 A1 Jul. 24, 2003

(51) Int. Cl.$^7$ ................................................. G11C 8/18

(52) U.S. Cl. .................. 365/233; 365/230.03; 365/191; 365/194; 365/189.05

(58) Field of Search .............................. 365/233, 233.5, 365/230.03, 230.06, 194, 191, 189.05

(56) References Cited

U.S. PATENT DOCUMENTS 5,467,033 A * 11/1995 Yip et al. ..................... 326/93

OTHER PUBLICATIONS

"A Study of Pipeline Architectures for High–Speed Synchronous DRAM'S", Hoi–Jun Yoo, IEEE Journal of Solid–State Circuits, vol. 32, No. 10, Oct. 1997, pp. 1597–1603.

* cited by examiner

*Primary Examiner*—Andrew Q. Tran
(74) *Attorney, Agent, or Firm*—Dilworth & Barrese, LLP

(57) ABSTRACT

A data clock system for a semiconductor memory system is provided for performing reliable high-speed data transfers. The semiconductor memory system includes a plurality of data banks configured for storing data, the plurality of data banks in operative communication with a plurality of first data paths, each first data path in operative communication with a second data path. The data clock system includes a first clock path receiving a clock signal during a data transfer operation for transferring data between one data bank of the plurality of data banks and the second data path via one of the plurality of first data paths; and a second clock path receiving the clock signal from the first clock path and propagating the clock signal along therethrough, the second clock path including at least one clock driver. The transfer of data between the one of the plurality of first data paths and the second data path occurs upon receipt of the clock signal by the at least one clock driver. A method for propagating a clock signal in a semiconductor memory system is also provided for performing reliable high-speed data transfers. In the inventive system and method the clock signal is delayed during propagation along the first clock path and the second clock path by approximately the same amount of time regardless if the at least one clock driver is positioned proximate a far end of the second clock path or the at least one clock driver is positioned proximate a near end of the second clock path.

18 Claims, 12 Drawing Sheets

SEMICONDUCTOR MEMORY SYSTEM HAVING A DATA CLOCK SYSTEM FOR RELIABLE HIGH-SPEED DATA TRANSFERS

FIELD OF THE INVENTION

This invention relates to the field of integrated circuit (IC) design. Specifically, it relates to a data clock system for reliable high-speed data transfers within a synchronous embedded semiconductor memory system having a micro-cell architecture arranged in a wave-pipe structure.

BACKGROUND OF THE INVENTION

EDRAMs with wide data bandwidth and wide internal bus width have been proposed to be used as L2 (Level-2) cache to replace pure SRAM cache. Since each DRAM memory cell is formed by a transistor and a capacitor, the size of DRAM cache is significantly smaller than that of SRAM cache. It is beneficial to use eDRAM systems in embedded applications, such as hand-held systems, for reducing size, power consumption and cost.

In order to meet performance requirements, an eDRAM is formed of a plurality of blocks or micro-cells arranged in arrays forming one or more banks. A block is a small DRAM array unit formed by a plurality of word lines (e.g., from 64 to 256) and a plurality of bitline pairs (e.g., from 64 to 256). The size of a block is much smaller (e.g., 16× to 256×) than that of a bank of a conventional stand-alone DRAM. Typically, one block of each eDRAM bank is activated within a clock cycle. In order to facilitate a high data-rate during data transfers it is possible for blocks from different banks to be accessed simultaneously for simultaneous read and write operations. The read and write speed of an eDRAM can be fast due to very light loading of word lines and bitlines.

While the data transferring speed in a high-performance memory is critical, the advantage of high speed is useless without reliable data transferring. Reliability of data is compromised by factors such as noise coupling, data pulse racing, incorrect data latching due to data skew and extra power due to signal glitch. In particular, in order to reduce timing-related problems for improving data reliability during data transferring, it is important to prevent data collision during data read operations regardless of the location in which the data is stored, and to correlate control and address signals properly during their transmission for insuring that the correct data is latched in data registers during each clock cycle.

In a known wave-pipe system for stand-alone DRAM described in "A Study of Pipeline Architectures for High-Speed Synchronous DRAM's" by Hoi-Jun Yoo, IEEE Journal of Solid State Circuits, Vol. 32, October 1997, pages 1597–1603, a self-resetting logic for reducing the pulse width is described. However, it has become common for pulse-widths to be increasingly smaller. Further, reduction of the pulse width adds a risk of additional data reliability problems.

Accordingly, a need exists for a high-speed semiconductor memory system and method for providing reliable high-speed data transfers in which timing-related data reliability problems are reduced. Furthermore, a need exists for a high-speed semiconductor memory system and method in which a data clock system is provided for reducing the possibility of a data collision during a read operation or latching the wrong data during a write operation. Furthermore, a need exists for a method and system for providing a data clock system having an increased timing window for reliable read and write operations without reducing the pulse width of the data clock.

SUMMARY

An aspect of the present invention is to provide a high-speed semiconductor memory system and method for providing reliable high-speed data transfers in which timing-related data reliability problems are reduced.

Another aspect of the present invention is to provide a high-speed semiconductor memory system and method in which a data clock system is provided for reducing the possibility of a data collision during a read operation or latching the wrong data during a write operation.

Another aspect of the present invention is to provide a method and system for providing a data clock system having an increased timing window for reliable read and write operations without reducing the pulse width of the data clock.

Accordingly, a data clock system for a semiconductor memory system is provided. The semiconductor memory system includes a plurality of data banks configured for storing data, the plurality of data banks in operative communication with a plurality of first data paths, each first data path in operative communication with a second data path. The data clock system includes a first clock path receiving a clock signal during a data transfer operation for transferring data between one data bank of the plurality of data banks and the second data path via one of the plurality of first data paths; and a second clock path receiving the clock signal from the first clock path and propagating the clock signal along therethrough, the second clock path including at least one clock driver. The transfer of data between the one of the plurality of first data paths and the second data path occurs upon receipt of the clock signal by the at least one clock driver. The clock signal is delayed during propagation along the first clock path and the second clock path by approximately the same amount of time regardless if the at least one clock driver is positioned proximate a far end of the second clock path or the at least one clock driver is positioned proximate a near end of the second clock path.

Furthermore, a method for propagating a clock signal in a semiconductor memory system is provided. The semiconductor memory includes a plurality of data banks configured for storing data, the plurality of data banks in operative communication with a plurality of first data paths. The method includes the steps of receiving a clock signal in a first clock path during a data transfer operation for transferring data between one data bank of the plurality of data banks and the second data path via one of the plurality of first data paths; receiving the clock signal in a second clock path; propagating the clock signal along the second clock path via at least one clock driver; and transferring the data between one of the first data paths and the second data path upon receipt of the clock signal by the at least one clock driver. The method further includes the step of delaying the clock signal by a clock delay during propagation of the clock signal along the first clock path and the second clock path until arriving at the associated clock driver. The clock delay is approximately the same when the associated clock driver is positioned proximate a far end of the second clock path and when the associated clock driver is positioned proximate a near end of the second clock path.

DETAILED DESCRIPTION OF THE INVENTION

The present invention provides a high capacity memory system, such as an embedded DRAM (eDRAM) system, having a micro-cell architecture, a wide data bandwidth and wide internal bus width, and data paths configured for implementing a data transfer protocol for achieving high-speed and high-integrity read operations regardless of the location of the data being transferred. A description will now be given as to the structure and operation of an exemplary high capacity embedded DRAM macro. The purpose of this description is to illustrate a data clock system for insuring data reliability during data transfers.

Figure 1:
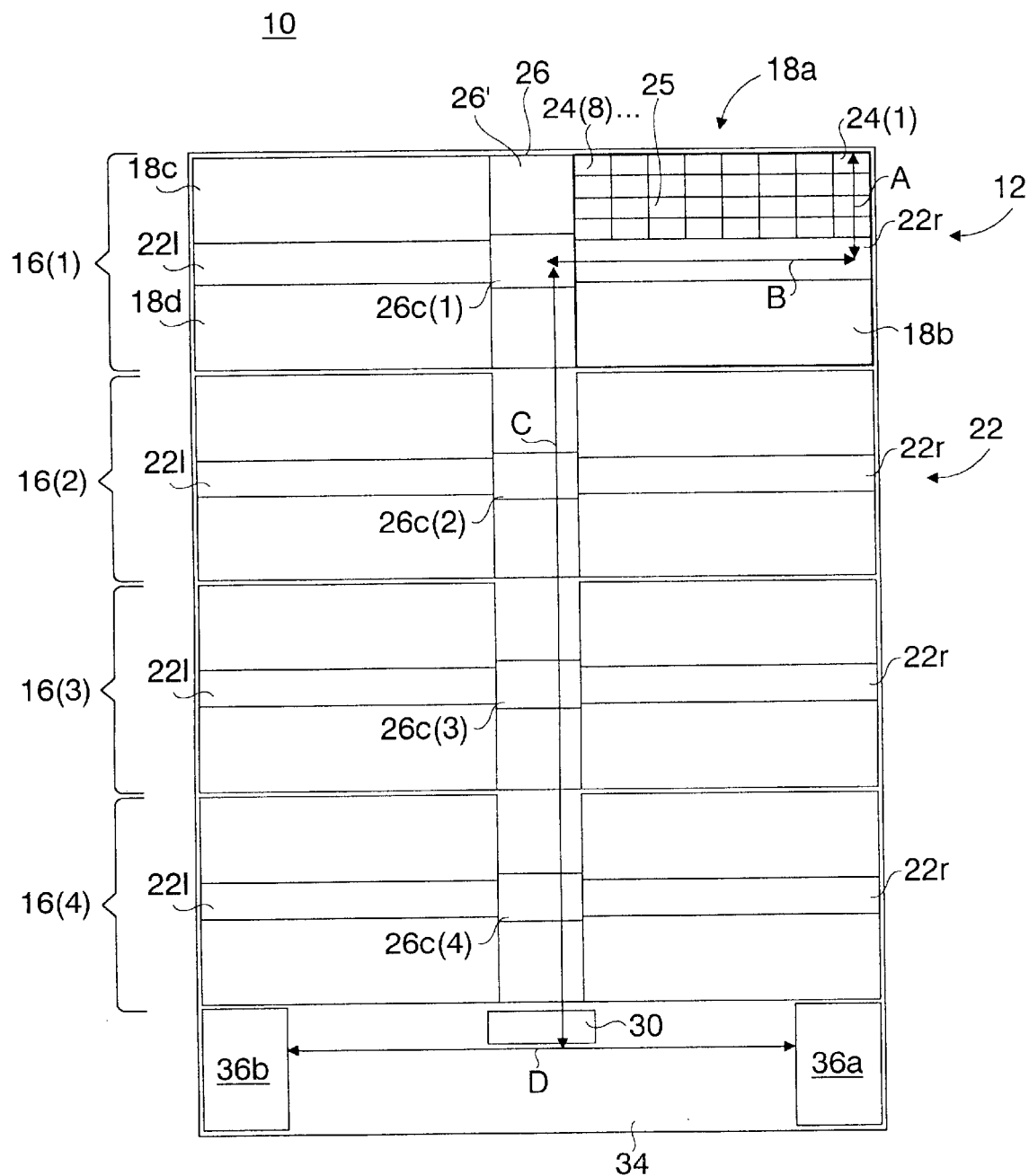
FIG. 1 is a block diagram of an exemplary eDRAM system having an eDRAM array including a micro-cell architecture according to the present invention.

With reference to FIG. 1, there is shown a block diagram of an exemplary high-capacity eDRAM system having a micro-cell architecture designated generally by reference numeral 10. The eDRAM system 10 includes an array of DRAM blocks 12. In the example shown in FIG. 1, the array 12 includes four blocks 16(m), where m=1–4, each storing 4 Mb of data.

Each of the blocks 16(1–4) includes four 1 Mb arrays 18a–d. Two 1 Mb arrays 18a,b are located on upper and lower corners, respectively, of the right side of each block 16(1–4). The other two 1 Mb arrays 18c,d, symmetric to arrays 18 a,b, are located on upper and lower corners, respectively, of the left side of each block 16(1–4). Arms 22, including right and left arms 22r,l, respectively, are located in each block 16(1–4), with the right arm 22r located between and shared by the upper array 18a and the lower array 18b, and the left arm 22l located between and shared by the upper array 18c and the lower array 18d. Each 1 Mb array 18a–d includes eight banks 24(n), where n=1–8, formed in parallel. Each bank 24(n) includes four micro-cell units 25 stacked vertically.

A central spine 26 is formed between the arrays on the left 18c, 18d and the arrays on the right 18a, 18b of the blocks 16(1–4). The central spine 26 includes shoulder regions 26c(m), where m=1–4, wherein each shoulder region 26c(m) joins the central spine 26 with one pair of left and right arm 22l, 22r, respectively. The central spine 26 provides a central data transfer path for data and control signals.

Figure 2A:
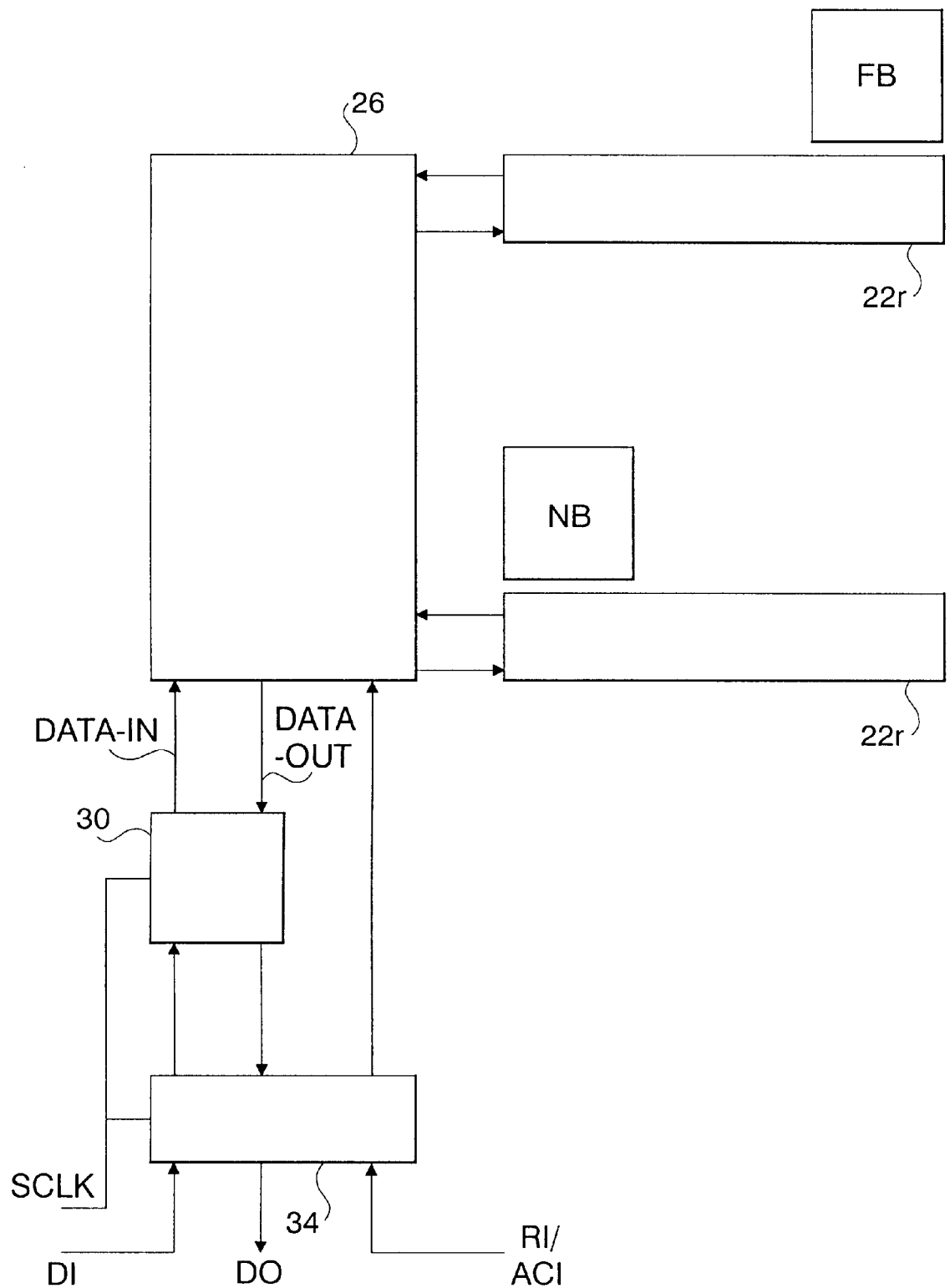
FIG. 2A is a block diagram showing data flow for data being exchanged with a far location and a near location according to the present invention.
Figure 2B:
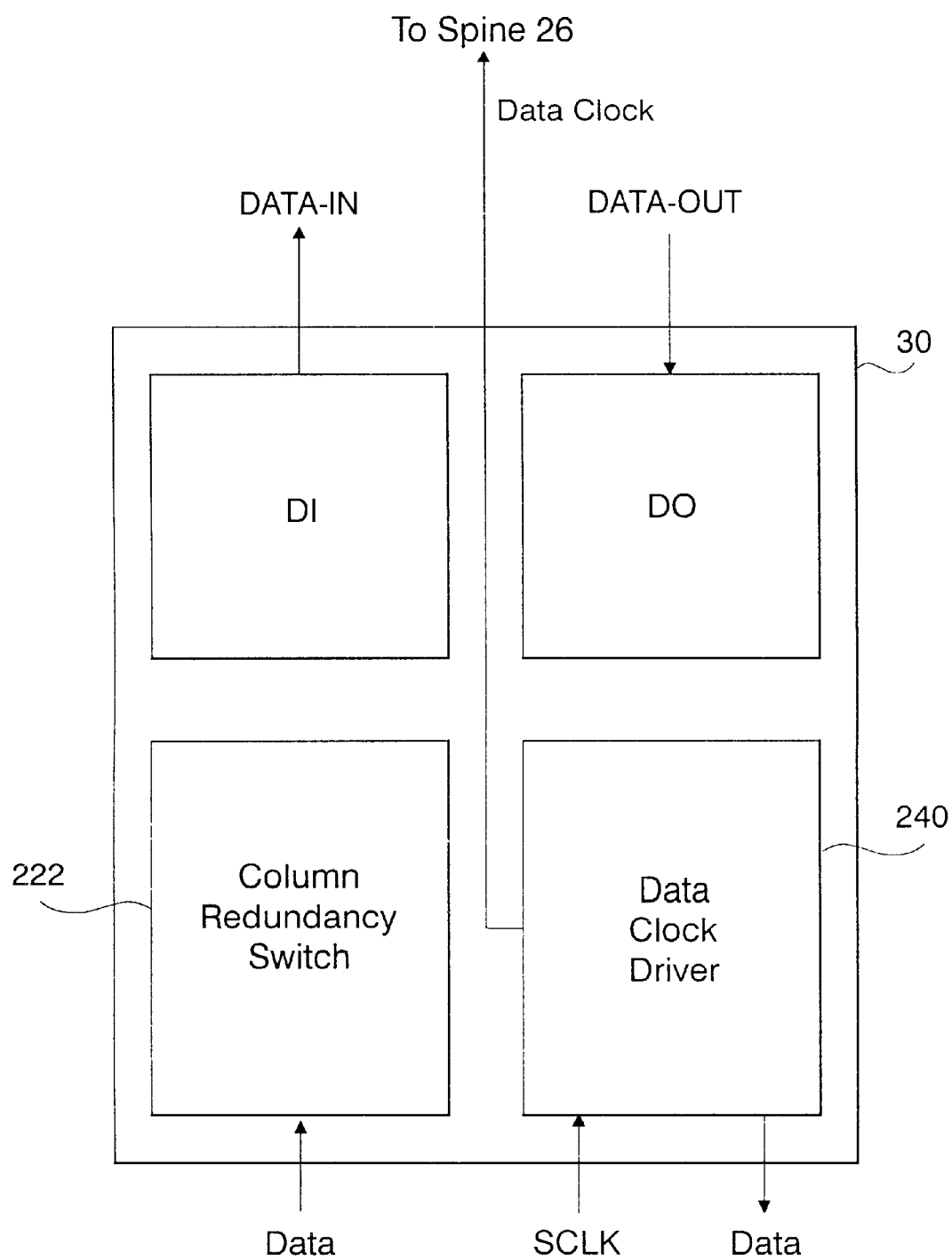
FIG. 2B is a block diagram of the neck region of the eDRAM system according to the present invention.

The central spine 26 connects below the blocks 16(1–4) to a neck region 30 which houses a column redundancy switch circuit 222, as shown in FIG. 2B, for determining whether data being transferred is transferred to (or from) normal bitlines or to (or from) redundant bitlines, as is known in the art. The neck region 30 is further connected to a head region 34, which houses a small SRAM array similar in size to an eDRAM block for providing a cache interface between the eDRAM blocks 16(1–4) and one or more processors, such as a CPU. Included in the SRAM array are two single-port SRAM macros 36a,b, which are provided for simultaneous read and write operations. The data transfer data path provided in the central spine 26 provides internal data buses for communication between the eDRAM blocks 16(1–4), the SRAM array within the head region 34 and the one or more processors.

During a write operation, data flowing from the head region 34 is directed through the neck region 30, the central spine 26, one of the shoulder region 26c(m), one of the arms 22l or 22r, to one of the 1 M array 18a,b,c or d, and to one of the destination micro-cell units 25. Likewise, during a read operation, data flowing from one of the micro-cell units 25 is directed through the corresponding arm 22l or 22r, the adjacent shoulder region 26c(m), the central spine 26, the neck region 30, and to the head region 34.

FIG. 1 shows an exemplary data transfer path A-D for transferring data during a data read transfer operation. It is to be understood that a data write path is similar to the data read path A-D, but in the reverse direction, i.e., D-A. During a data read transfer operation, path A is the path for data being transferred from cells of a wordline in a micro-cell unit 25 belonging to one of the blocks 16(1–4) associated with a secondary sense amplifier latch in the corresponding arm 22. The data is first amplified by primary sense amplifiers associated with each micro-cell 25, and then by corresponding secondary sense amplifiers associated with each bank 24(n), as is known in the art. During the data read transfer operation, path B is the path for transferring the data from path A by way of an arm 22l,r to the adjacent shoulder region 26c(m). During the data read transfer operation, path C is the path for transferring data from the shoulder region 26c(m) along the central spine 26 to the neck region 30 of the head region 34. Depending on the location of the micro-cell unit 25 from which the data is being read, the data may be passed through a shoulder region 26c(n) located close to or farther from the head region 34. The traveling time of the data increases the farther the data is located from the head region 34. Finally, during the data read transfer operation, path D is the path for transferring data through the neck region 30 and then to one of the SRAM macros 36a,b of the SRAM array within the head region 34.

As is understood by one skilled in the art, during a data write transfer operation data being transferred follows path D from the head region 34 to the neck region 30, after which the data follows path C from the neck region along the central spine 26 to the shoulder region. 26c(m) associated with the arm 22l,r associated with the data bank 24(n) having the destination micro-cell 25. During the data write transfer operation the data follows path B from the shoulder region 26c(m) to the associated arm 22l,r. Finally, during the data write transfer operation, the data follows path A from the arm 22l,r to the activated word line of a micro-cell 25, as is known in the art.

Referring to FIG. 2A, exemplary banks near bank NB and far bank FB, from blocks 16(4) and 16(1), respectively, are shown exchanging data with the neck region 30 and head region 34 via the right arm 22r and the central spine 26. DATA_IN are the data signals transmitted from the neck region 30 to the central spine 26. DATA_OUT are the data signals transmitted from the central spine 26 to the neck region 30. The first bank NB is the bank located nearest to the neck region 30. The first bank (i.e., the near bank) 24(8) is located at a near end of the arm 22r, and the lowest block 16(4) is located nearest to the neck region 30. The second bank FB is the bank located farthest from the neck region 30. The second bank (i.e., the far bank) 24(1) is located at a far end of the arm 22r and the highest block 16(1) is located farthest from the neck region 30. The near and far banks NB, FB are shown to illustrate timing problems associated with transfer of data from different locations located at different distances from the neck region 30.

As shown in FIG. 2A, a system clock SCLK is provided to the head region 34 and the neck region 30. The head region 34 further receives incoming data (DI), redundancy information (RI) and address control information (ACI) from a source, such as a central processing unit (CPU). The head region 34 outputs outgoing data (DO) to the source. The head region 34 further exchanges data with the neck region 30. The head region exchanges address control information (ACI) directly with the spine. The head region 34 includes registers for holding information passing through the head region 34.

FIG. 2B shows the neck region 30 in greater detail. The neck region 30 is shown to include outgoing data registers DO and incoming data registers DI, which exchange data with the central spine 26. The neck region 30 further includes a column redundancy switch 222, which exchanges data with the head region 34. The outgoing data register 210 may be a First-In-First-Out (FIFO) register to further direct data flow. FIFO registers are well known in the art and will not be further described. The neck region 30 further includes a data clock driver 240, which receives the SCLK signal and generates a data clock signal.

During a data transfer operation, a greater amount of time is required for the transmittal of data to and from the far bank 24(1) of block 16(1) than to the near bank 24(8) of block 16(4). If during a data read operation the time required for transmittal of data from the far bank 24(8) exceeds the time required for transmittal of data to and from the near bank 24(1) by a time interval greater than a clock cycle, then the data being read from the near bank is apt to collide with the data being read from the far bank, jeopardizing the integrity of the data being read, as illustrated in FIG. 3B.

Figure 3A:
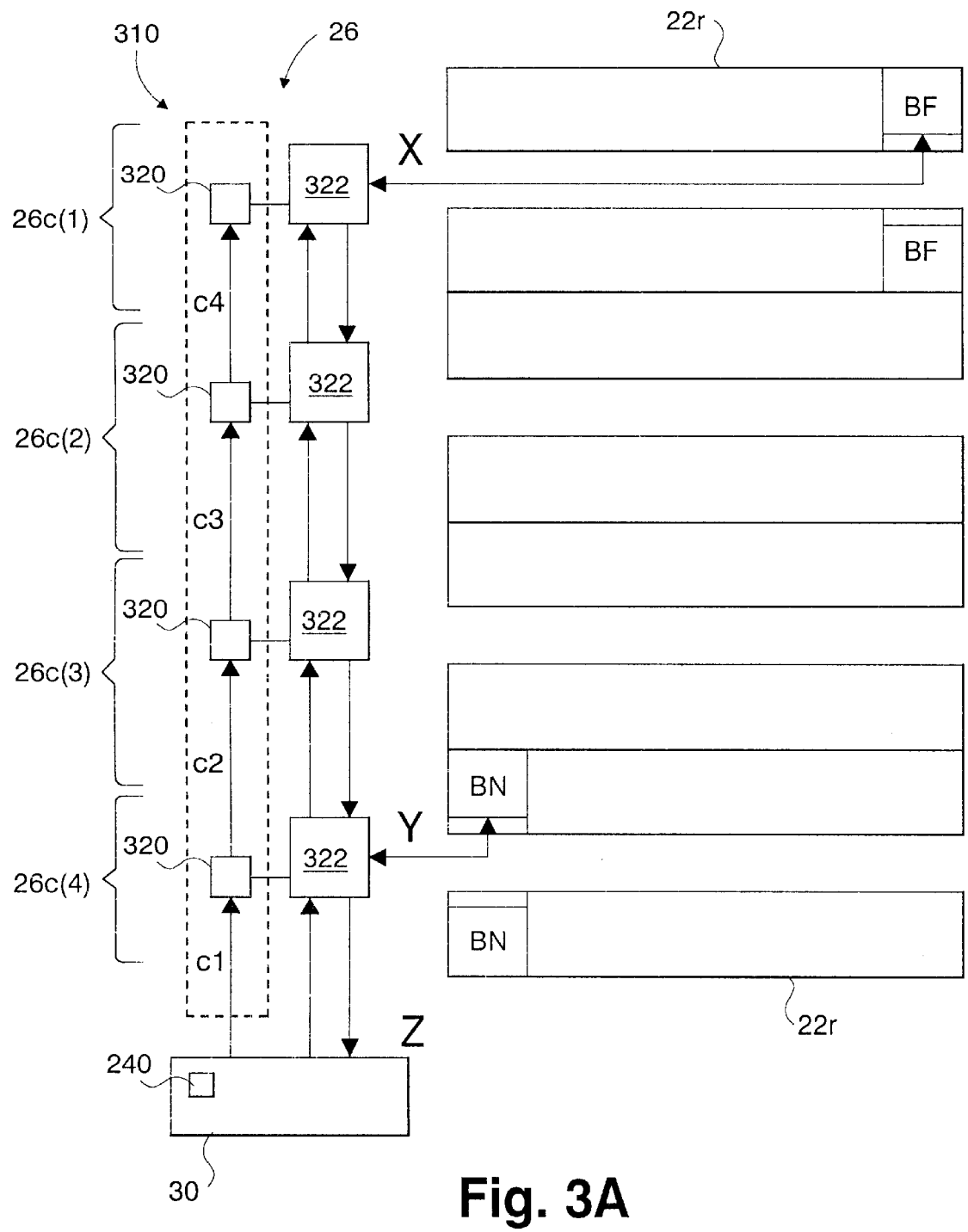
FIG. 3A is a block diagram of a forwarded data clock system and data flow in the spine and arms of the eDRAM array according to the prior art.
Figure 3B:
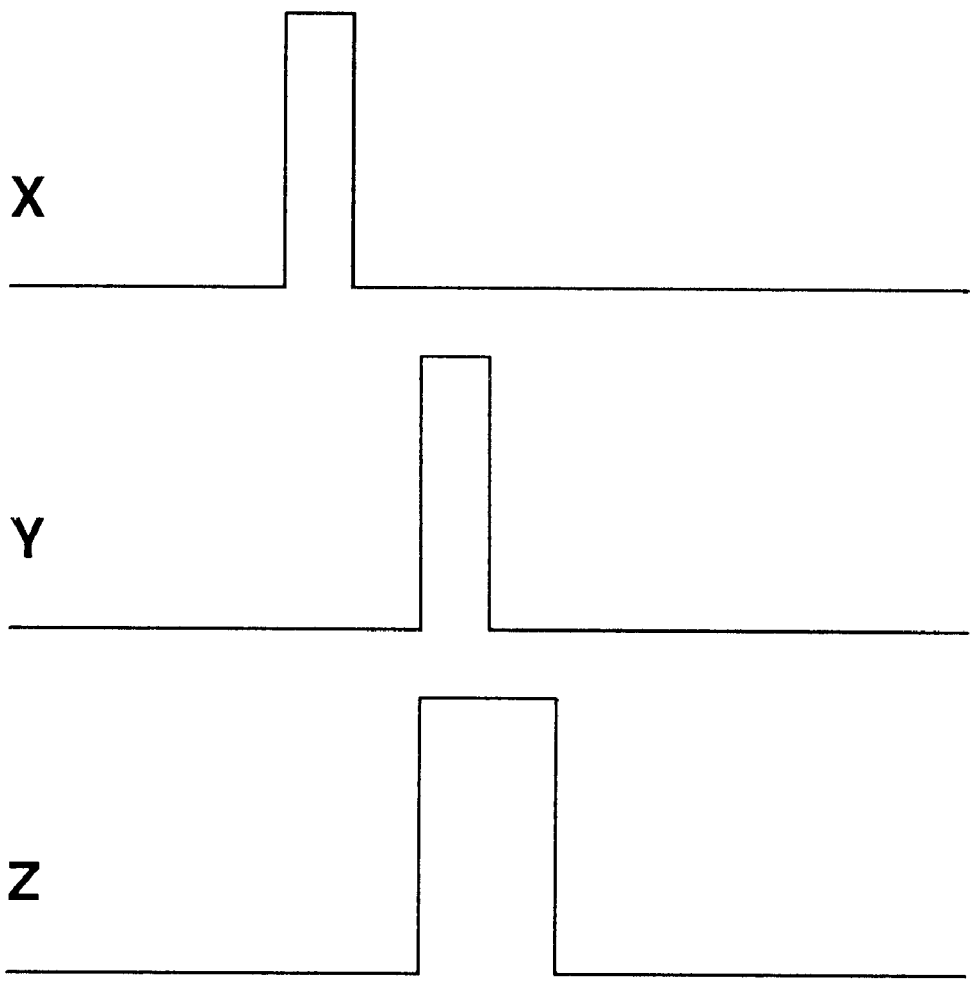
FIG. 3B is a wave form diagram of data signals as propagated in FIG. 3A according to the prior art.

FIG. 3A shows a conventional clock system investigated by the inventors in which a forward data clock system 310 is provided for control of data wave pipe transfer through arms 22r and the central spine 26 of the eDRAM array. The forwarded data clock system 310 includes a data clock driver 320 in each shoulder 26c(m). The data clock driver 320 of each shoulder 26c(m) is connected to an associated data transfer switch driver located in the same shoulder 26c(m). The data clock drivers 320 of shoulders 26c(1–4) and data transfer switches 322 of shoulders 26c(1–4) are in operative communication for passing data clock pulses and data signals through the spine. Each time that a clock signal is transferred through one of the data clock drivers 320, the clock signal is delayed. Each time that a data signal is transferred through one of the data transfer switches 322, the data signal is delayed to match the clock.

For each data transfer operation the data clock driver 240 provided in the neck region 30 provides a first data clock pulse c1 delayed by a propagation delay to the data clock driver 320 of the shoulder region 26c(4) adjacent to the neck region 30. Upon the data clock driver 320 of each consecutive shoulder region 26c(m) receiving a clock pulse cN, where N=2–4, the data clock driver 320 redrives the clock pulse cN and transfers the clock pulse cN delayed by a propagation delay to the data clock driver 320 of the next shoulder region 26c(m), until the clock pulse cN has reached the shoulder region 26c(m) connected to the arm 22r,l associated with the data bank targeted for the data transfer.

Thereupon, the data being transferred is transferred to the appropriate first or second data transfer switch block 322 of the shoulder region 26c(m) reached, for transfer of the data to or from the data lines of the arm 22l,r in accordance with the data transfer operation. For a read data transfer operation, the data being transferred is transferred through the data transfer switch blocks 322 transferring the data sequentially to the previous adjacent shoulder regions 26c(m) and then to the neck region 30. For a write data transfer operation, the data being transferred is transferred from the neck region 30 and sequentially to the next shoulder region 26c(m) until being transferred to an arm 22r,l; each transfer occurring as the clock pulse cN is being transferred.

Two symmetric far banks FB and two symmetric near banks NB are shown exchanging data with the central spine 26. For a data read operation, four arm propagation delays corresponding to the clock pulses c1–c4 occur when reading from one of the far data banks FB, upon which four arm propagation delays corresponding to transfer of the data through each of the shoulders 26c(1–4) occur while transferring the data to the neck region 30. When reading from one of the near data banks NB, one arm propagation delay corresponding to the clock pulse c1 is generated, upon which one arm propagation delay corresponding to transfer of the data through the shoulder 26c(4) occurs while transferring the data to the neck region.

Data signals X, Y and Z generated during read operations are shown, where signal X is a data signal output from one of the far banks FB, signal Y is a data signal output from one of the near banks NB, and signal Z is a data signal transmitted by the central spine 26 to the neck region 30.

FIG. 3B shows the wave forms of signals X, Y and Z. The signal pulse of signal X from one of the FBs collides with the signal pulse of signal Y from one of the NBs, such that they merge into one large signal pulse Z, which is transmitted to the neck region 30. The data being transmitted via signals X and Y is corrupted and is no longer reliable. Therefore, the forwarded clock system 310 does not solve the problem associated with data integrity during data read transfer operations.

Figure 4A:
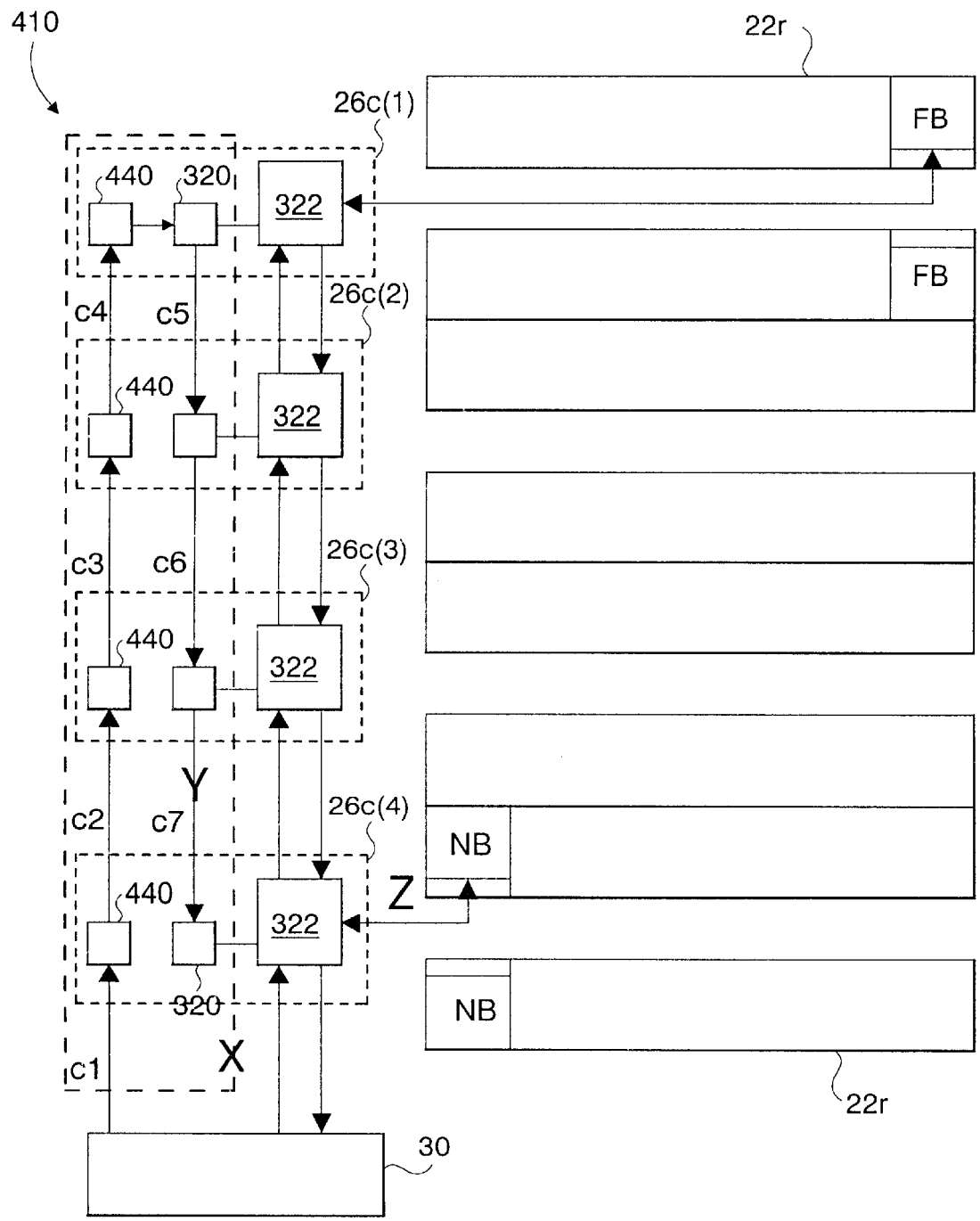
FIG. 4A is a block diagram of a round trip data clock system and data flow in the spine and arms of the eDRAM array according to the present invention.

FIG. 4A shows a solution investigated by the inventors in which a round-trip data clock system 410 is proposed for preventing data collision during data read operations when reading consecutively from a far bank and a near bank. The data clock system 410 includes one of the data clock drivers 320 and a modified data clock driver 440 located at each shoulder region 26c(m). The data clock driver 320 of each shoulder 26c(m) is connected to an associated data transfer switch located in the same shoulder 26c(m), as in the forward data clock system 310. The data clock drivers 320 of shoulders 26c(1–4) and data transfer switches 322 of shoulders 26c(1–4) are in operative communication for passing data clock pulses and data signals through the spine.

For each data transfer operation, the data clock driver block 240 provided in the neck region 30 provides the first data clock pulse delayed by a delay c1 to the modified data clock driver 440 of the shoulder region 26c(4) adjacent to the neck region 30. Upon the modified data clock driver 440 of each consecutive shoulder region 26c(m) receiving the clock pulse, the modified data clock driver 440 re-drives the clock pulse and transfers the clock pulse, with a clock delay of cN, where N=2–4, to the modified data clock driver 440 of the next shoulder region 26c(m), until the clock pulse has reached the modified data clock driver 440 of the top shoulder region 26c(1). Thereafter, the round trip data clock system 410 operates similarly to the forward data clock system 310, except that the modified data clock driver 440 of the top-shoulder region 26c(1) transfers the clock pulse to the data clock driver 320 of the top shoulder region 26c(1). Upon the data clock driver 320 of each consecutive shoulder region 26c(m) receiving the clock pulse, the data clock driver 320 re-drives the clock pulse and provides the clock pulse delayed by a delay cN, where N=5–7, to the data clock driver 320 of the previous shoulder region 26c(m). When the clock pulse cN has reached the shoulder region 26c(m) connected to the arm 22r,l associated with the data bank targeted for the data transfer, the data is transferred in the same manner as described for the forward data clock system 310.

The round trip data clock solves the data collision problem associated with read operations since the total propagation delays is extended to seven clock pulses c1–c7 before activating a bank address of one of the near banks NB. However, during a data write operation, a data address latching problem exists. The propagation delay for transferring incoming data being written to the near banks NB cannot be extended by extending the route through which the data is propagated by matching the round trip data clock path, since that would cause the width of the central spine 26 to be virtually doubled.

To illustrate the address latching problem associated with write operations, data signals X, Y and Z generated during write operations are shown, where signal X is an incoming data signal being written to one of the near banks NB, signal Y is the delayed clock pulse at the time when the bank address is activated for a previous write operation, and signal Z is the data signal being written to the bank corresponding to the bank address activated. Data corruption may occur during a data write operation when an address is selected for having data written to a data bank associated with the address, where the selection is delayed due to the data bank being in a far location. When a next set of data is provided for a next data write operation, it is probable that the next set of data will be written into the data bank associated with the delayed address, thus causing data corruption.

Figure 4B:
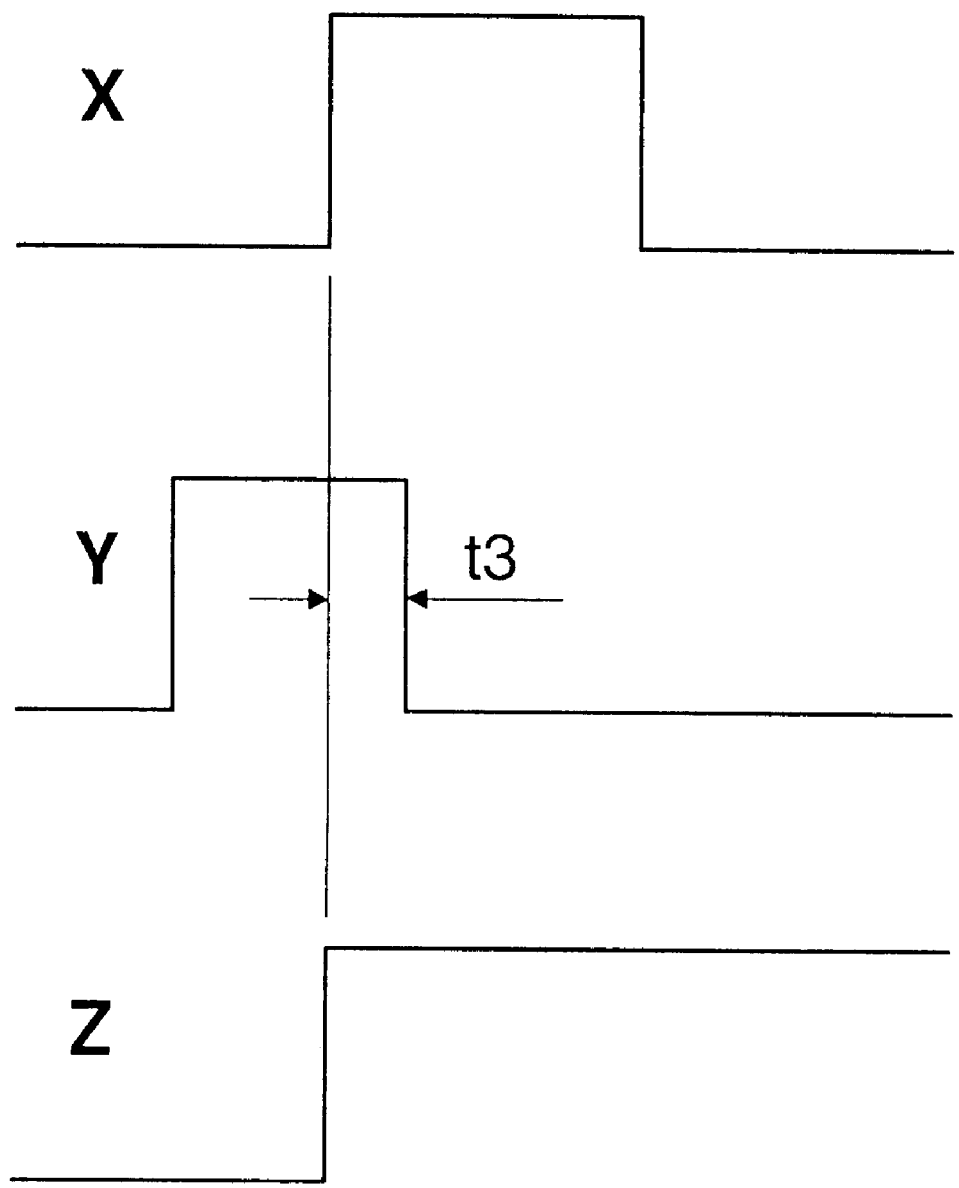
FIG. 4B is a wave form diagram of data signals as propagated in FIG. 4A according to the present invention.

FIG. 4B shows the wave forms of signals X, Y and Z, where X is a data signal, Y is a clock signal and Z is an address signal. The clock pulse of signal Y was delayed by the extended delay and is still active "high" when data pulse X for the next write operation is transferred from the neck region 30 to the first shoulder 26c(4). The margin of time t3 is shown, during which the clock pulse of signal Y extends into the time at which the data pulse of signal X begins. The data being transferred via signal X is transferred as signal Z and written into the bank address activated by the clock pulse of signal Y from the previous write operation. The data of signal Z being written into the bank corresponding to the activated bank address is corrupted and is no longer reliable. Therefore, the round trip clock system 410 does not solve the problem associated with data integrity during data write transfer operations.

Figure 5:
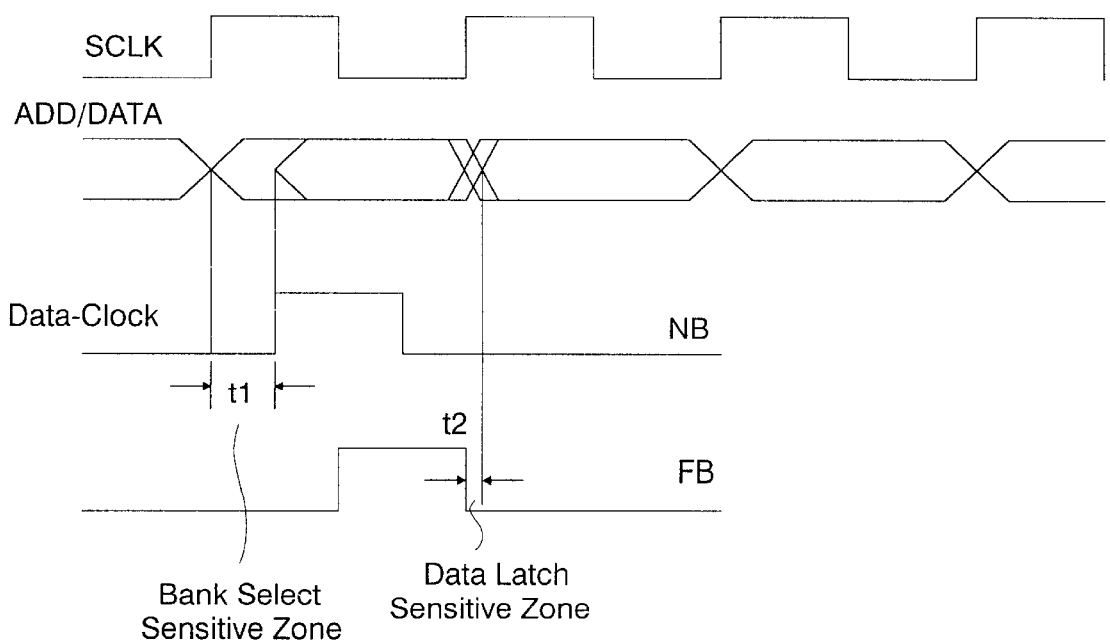
FIG. 5 is a wave form diagram illustrating read/write windows of a data clock according to the present invention.

FIG. 5 shows sensitive zones in which the data clock pulse should not be activated for avoiding data corruption during read and write data transfer operations. The system clock signal SCLK, data and address signals being transferred and the data clock pulse signals for a near bank NB and a far bank FB are shown. The data clock signal is delayed relative to the system clock. The address signals are used to determine a bank selection signal. During a decoding time interval for decoding the address signal, which is the bank select sensitive zone t1, if the data clock is moved early enough to be within t1 of the SCLK edge, the data clock will come in too early to be combined with the correct bank select signal, such as via the NAND gate GR or GL in box 620 of FIG. 7. The delay of the data clock must be controlled so that the data clock pulse signal is not active high during the bank select sensitive zone t1 for preventing data collisions during a read operation, and the data latch sensitive zone t2 for preventing latching of data to a wrong address during a write operation.

Figure 6A:
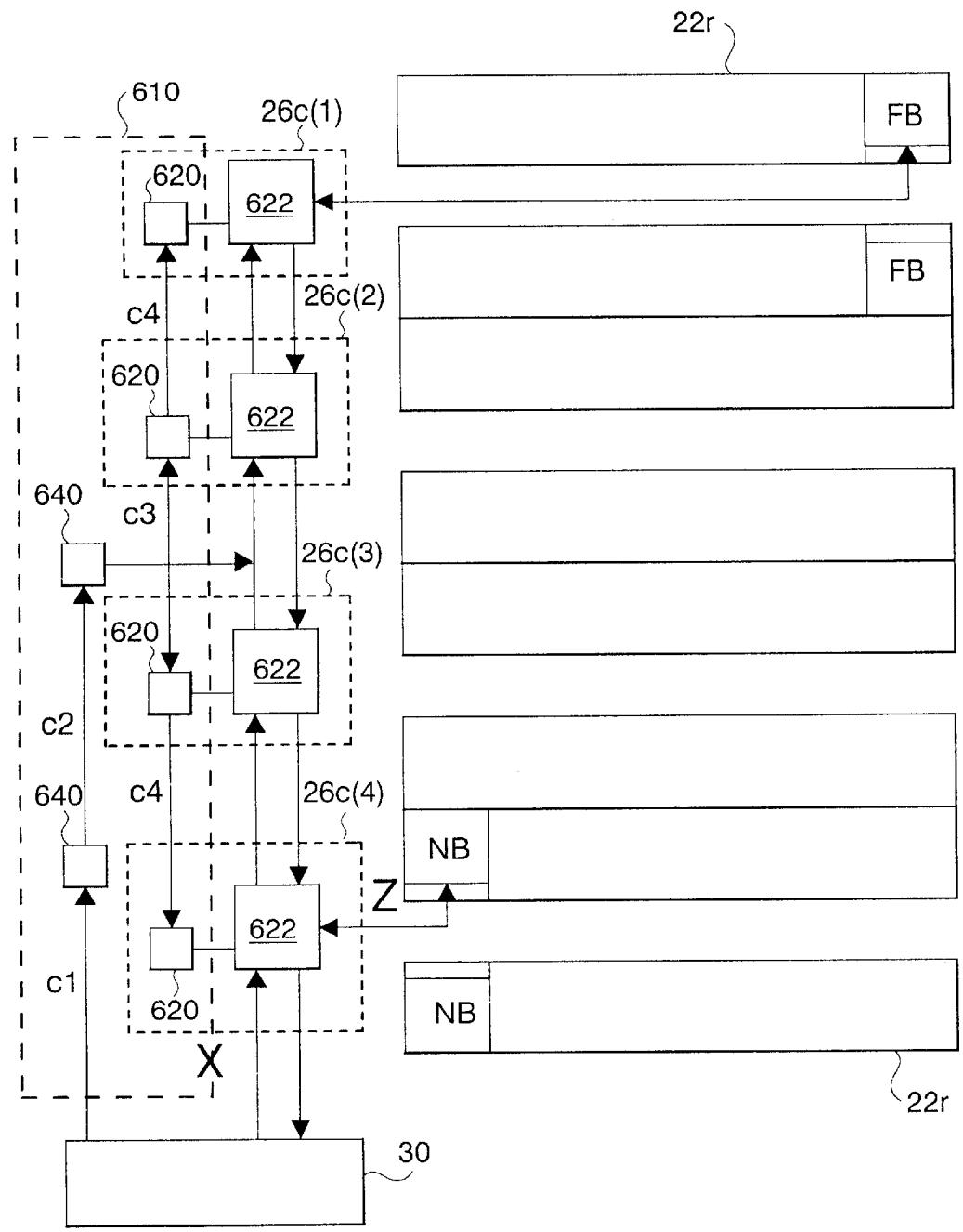
FIG. 6A is a block diagram of a distributed data clock system and data flow in the spine and arms of the eDRAM array according to the present invention.

FIG. 6A shows the preferred embodiment for a distributed data clock system, which provides a delayed clock pulse wherein the delay is controlled so that the clock pulse is not active "high" during the sensitive zones for read and write data transfer operations. The distributed data clock system 610 includes a data clock driver block 620 located at each shoulder region 26c(m) and first and second modified data clock driver blocks 640. The data clock driver block 620 of each shoulder 26c(m) is connected to an associated data transfer switch block 622. Each data transfer switch block includes a set of data write switch blocks 622w(n), where n=1–152 (shown in FIG. 7), and a set of data read switch blocks (not shown) located in the same shoulder 26c(m). The modified data clock driver blocks 640 and the data clock driver blocks 620 of shoulder regions 26c(1–4) are in data communication for transferring a data clock signal from the neck region 30 through the spine 26. The data write switch blocks 622w(n) of shoulder regions 26c(1–4) are in data communication, and the data read switch blocks of shoulder regions 26c(1–4) are in data communication for transferring 152 data signals through the spine 26 and to and from associated left and right arms 22l,r, respectively.

Figure 7:
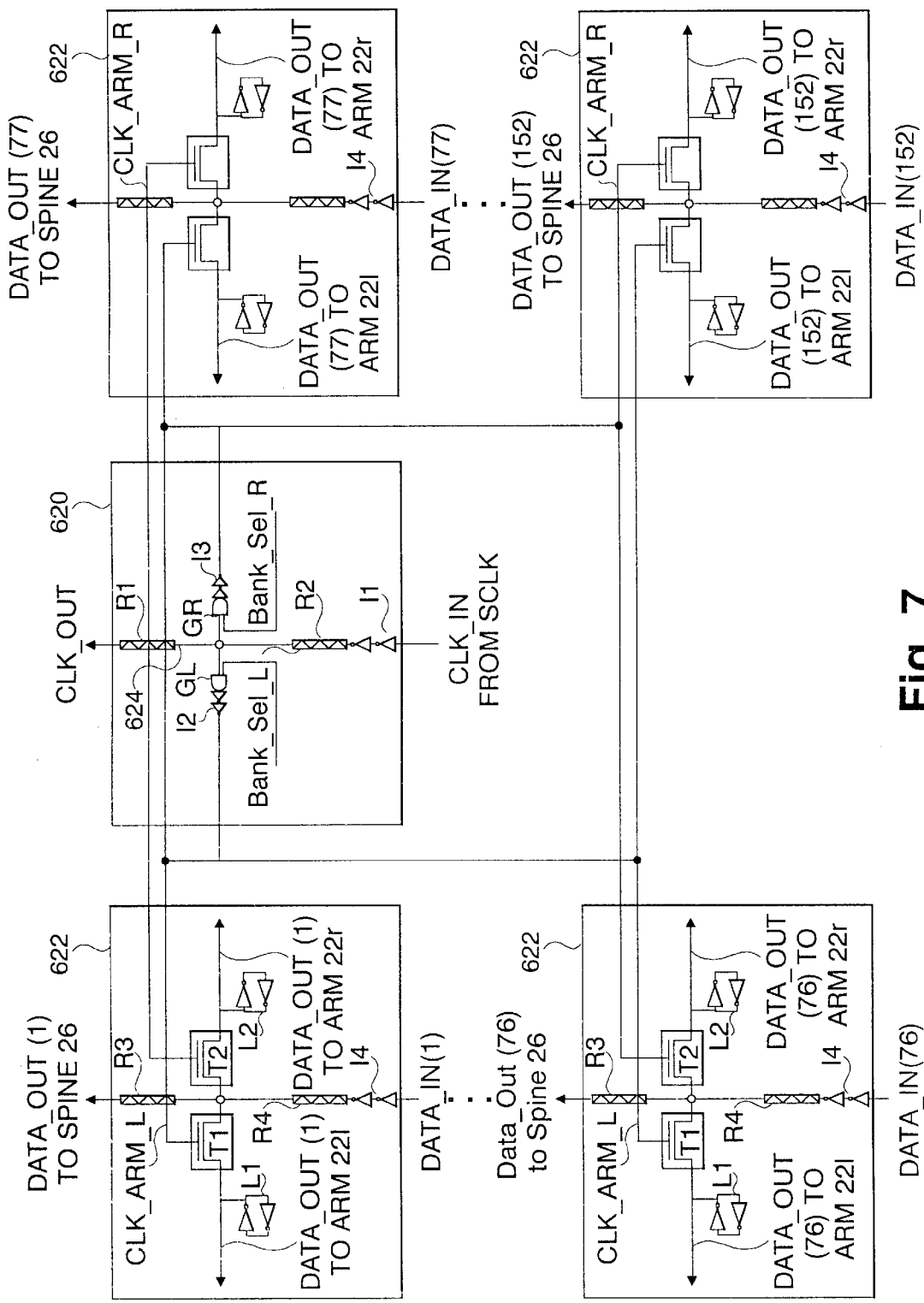
FIG. 7 is a circuit diagram of a data clock driver block and data write switch blocks according to the present invention.

The preferred data clock driver block 620 and preferred data write switch blocks 622w(1–152) are shown in FIG. 7. As shown in FIG. 7, the 152 data write switch blocks 622w(1–152) are arranged with 76 of each of the data write switch blocks 622w(n) on each of the left and right sides of the data clock driver block 620.

Referring to the data clock driver block 620 of FIG. 7, each data clock driver block 620 includes a first pair of buffering inverters I1 connected to a data clock data line 624 along which the data clock pulse is propagated. Parasitic resistors R1 and R2 are formed along the data clock data line 624. It is understood by one skilled in the art that circuitry may be included in addition to resistors R1 and R2 for controlling the data clock pulse and the delay thereof. The data clock data line 624 is connected at a node located between the resistors R1 and R2 to a first AND gate GL, which is connected in series to a second pair of buffering inverters I2, and a second AND gate GR, which is connected in series to a third pair of buffering inverters I3. The first and second modified data clock driver blocks 640 are preferably similar to the data clock driver block 620. However they do not include the second and third pairs of buffering inverters I2, I3 and the first and second AND logic gates GL, GR.

The data clock driver block 620 receives the data clock pulse as signal DCLK_IN from the shoulder region 26c(m) or modified data clock driver block 640, and outputs the data clock pulse as signal DCLK_OUT to the shoulder region 26c(m) directly above. The DCLK_OUT signal is delayed by a predetermined delay relative to the DCLK_IN signal, where the delay is determined by the resistance of the resistors R1, R2. The data clock pulse passing out of the resistor R1 is further provided to the first and second AND gates GL, GR, respectively.

During a data transfer operation, the first and second modified data clock driver blocks 640 receive the data clock pulse from the data clock driver 240 of the neck region 30, and propagate the data clock pulse to a midpoint of the spine 26. As the first data clock pulse c1 is propagated from the neck region 30 to the first modified data clock driver block 640, a first propagation delay occurs. As a second data clock pulse c2 is propagated from the first modified data clock driver 640 to the second modified data clock driver 640, a second propagation delay is generated. The second modified data clock driver 640 propagates the third data clock pulse c3 to the data clock driver block 620 of the middle shoulder regions 26c(2) and 26c(3), thus generating a third propagation delay c3. Thereafter, the fourth data clock pulse is propagated to the data clock driver block 620 of the top shoulder 26c(1) and the bottom shoulder 26c(4), respectively, generating a fourth propagation delay c4.

The data clock driver 620 of shoulder 26c(m) further receives a BankSelR(m) or BankSelL(m), for m=1–4, for selecting the left or right arm 22l,r, respectively, which are provided to the first and second AND gates GL,GR, respectively. The BankSel(m)L,R signals are pre-decoded signals provided from the shoulder region 26c(m) indicating the arm 22l,r at which the data bank exchanging data is located. Only one BankSel(m)L or BankSel(m)R signal is active "high" for each data write and read operation, respectively. The AND gates GL, GR output a CLK_ARM_L and CLK₁₃ ARM_R signal, respectively, which are buffered by the buffering inverter pairs I2, I3, respectively, thus, the CLK_ARM_L and CLK_ARM_R signals are "high" when the delayed data clock signal is "high", and the BankSel(m)L or BankSel(m)R signal is "high", respectively, indicating that the left or right arm 22l,r, respectively, is selected as the arm 22l,r with which data is being transferred.

Referring to the data write switch blocks 622w(n) shown in FIG. 7, each data write switch block 622w(n), where n=1–152, includes a pair of buffering inverters 14 and parasitic resistors R3 and R4, pass gates T1, T2 and latches L1, L2. It is understood by one skilled in the art that circuitry may be included in addition to resistors R3 and R4 for controlling the data signal and the delay thereof. An incoming data signal DATA_IN is routed to either the left arm 22l via the pass gate T1 into latch L1, or the right arm 22r via the pass gate T2 into latch L2.

The data line 628 is connected at a node located in between the resistors R3 and R4 to the source of first and second transistors T1, T2. First and second latches L1, L2, respectively, are connected to the drain of the first and second transistors T1, T2, respectively for latching data stored by the first and second transistors T1, T2. The first and second transistors T1, T2 are connected at their control gates to the outputs of the AND gate/inverter pairs GL/I2 and GR/I3, respectively, for controlling storage of data signals by the first and second transistors T1, T2, respectively.

Each data write switch block 622w(n) receives a data_IN(n) signal, where n=1–152, from the neck region or the data write switch block 622w(n) of the shoulder region 26c(m) below. Each received data_IN(n) signal is delayed by at least one of parasitic resistors R3, R4 and is output as a data_OUT(n) signal, where n=1–152, to the selected arm or to the data write switch block 622w(n) of the next shoulder 26c(m) above in the spine 26. The transistors T1, T2, operating as switches, are controlled by the CLK_ARM_L, CLK_ARM_R signals, respectively, for receiving the received data_IN(n) signal and propagating the data_IN(n) signal to the left or right arm 22l, 22r, respectively. Once data is directed to one of the transistors T1, T2, the associated latch L1, L2, respectively, stores the data.

During a data write operation, the data clock pulse is sent from the neck region 30 and propagated through the first and second modified data clock driver blocks 640 to a midpoint of the spine 26, from where it is fed upward towards the top and downward towards the bottom of the spine, so that the data clock delay to the top shoulder 26c(1) and the bottom shoulder 26c(4) is approximately equal. The data_IN (1–152) signals are received as data pulses from the neck region 30 and propagated through write data switch blocks 622w(1–152) of at least one consecutive shoulder 26c(m) for transmission through the spine 26. Upon arrival of the data_IN(1–152) signals at the shoulder 26c(m) that is associated with the arm 22l,r having the data bank being written to, the transistors T1 or T2 of each data write switch block 622w(n) connected to the data lines of the associated arm are activated for propagating the data to the data lines.

In the distributed data clock system 610, both the data read and write timings are successfully met for insuring data reliability. To illustrate, simulated waveforms are shown in FIGS. 6B,C.

Figure 6B:
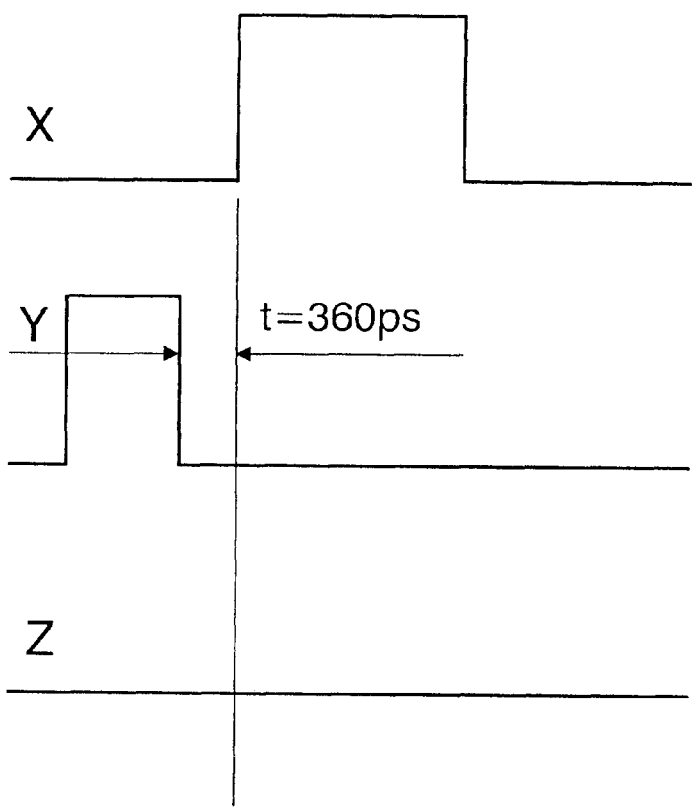
FIG. 6B is a wave form diagram of data signals as propagated in FIG. 6A during a write operation according to the present invention.

FIG. 6B shows wave forms generated during a data write operation, where signal X is an incoming data signal being written to one of the near banks NB, signal Y is the delayed clock pulse at the time when the bank address is activated for a previous write operation, and signal Z is the data signal being written to the bank corresponding to the bank address activated. A margin t of 360 ps is provided between the data clock pulse Y of the previous data write operation and the data signal X of data being written to one of the near banks NB during the current data write operation for preventing latching of the data of data pulse signal X to the wrong address.

Figure 6C:
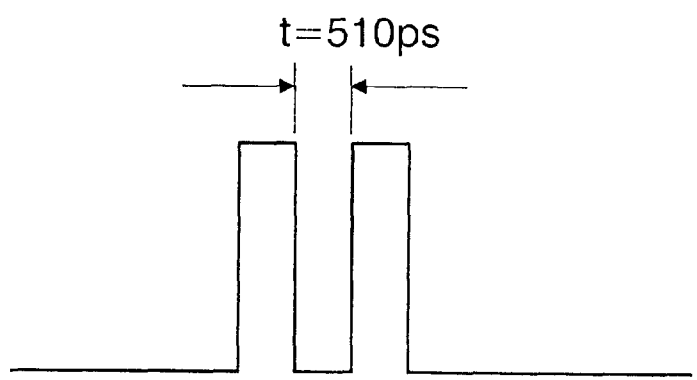
FIG. 6C is a wave form diagram of data signals as propagated in FIG. 6A during a read operation according to the present invention.

FIG. 6C shows the wave forms generated for a data pulse PF retrieved from a far bank FB followed by a data pulse PN retrieved from a near bank NB during a read operation. A margin t of 510 ps is provided between the PN and PF for preventing a data collision when reading consecutively from one of the far banks FB and one of the near banks NB.

It is understood by one skilled in the art that the width of the data clock pulse, used as an active high signal to latch data into the right/left arms 22l,r via the pass gates T1, T2, can be reduced in order to increase the margins provided for the bank select sensitive zone t1 and the data latch sensitive zone t2.

Figure 8:
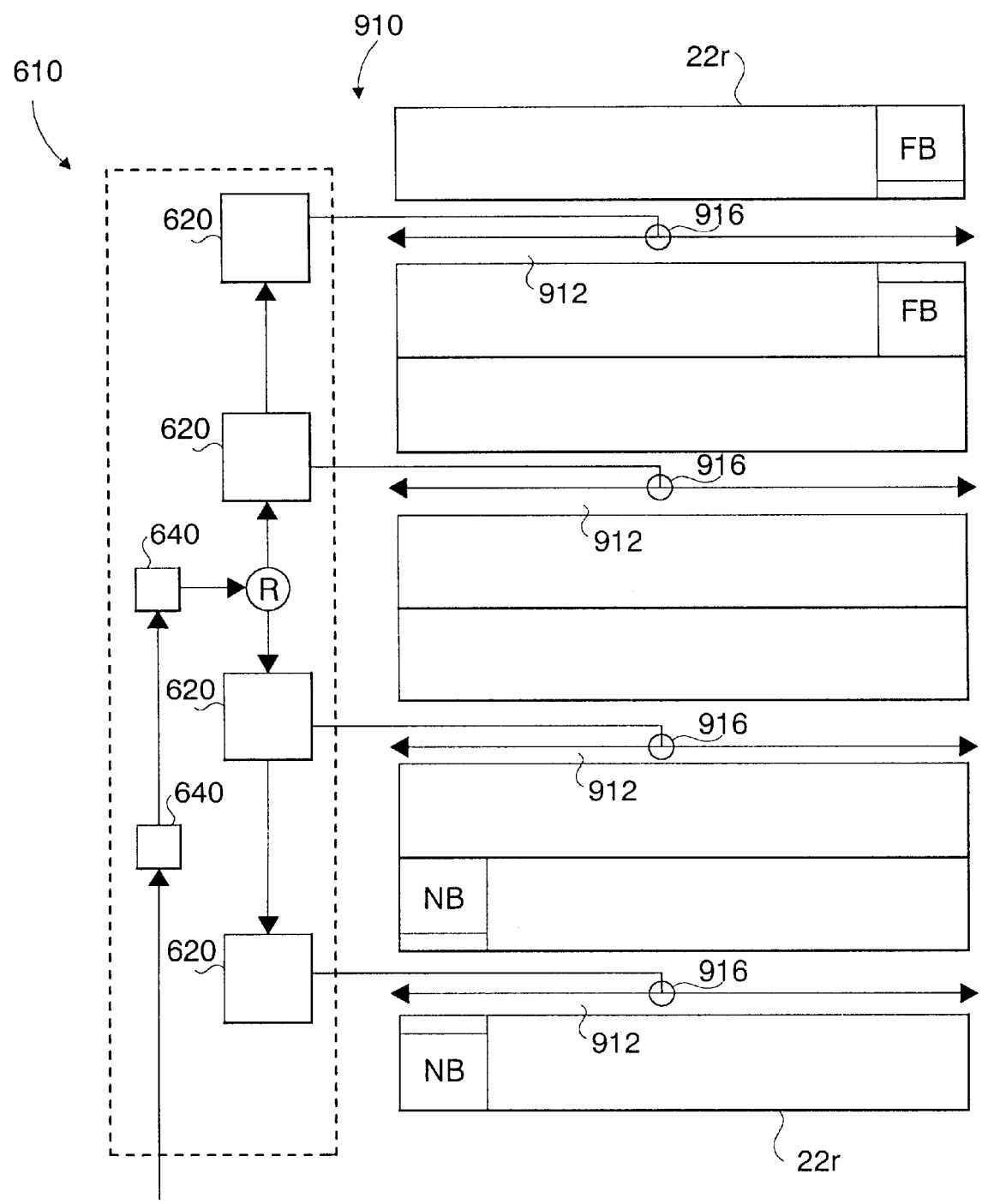
FIG. 8 is a block diagram of a fully distributed clock system and data flow in the spine and arms of the eDRAM array according to the present invention.

FIG. 8 shows a fully distributed data clock system 910, where the data clock includes the distributed data clock system 610, and an arm distributed clock 912 for further distributing the data clock along the arm 22r,l. The distributed data clock system 910 is hierarchical, such that upon the data clock pulse arriving at the shoulder 26c(m) associated with the arm having the data bank with which data is being transferred, the data clock pulse is propagated along the arm 22r,l. The arm distributed data clock system 912 of the arm includes at least one arm modified data clock driver block (not shown) similar in structure and function to the modified data clock driver block 640.

The data clock pulse is propagated from the data clock driver block 620 of the shoulder 26c(m) associated with the target arm 22r,l having the data bank with which data is being transferred through to the arm data clock driver block of a junction closest located at a midpoint 916 of the associated shoulder 26c(m). The data clock pulse is propagated along the associated arm 22r,l.

The arm data clock driver block is provided with a Bank Address signal similar to the BankSel(m)L,R signal for selecting the address of the data bank the data is being transferred with. The Bank Address signal is a decoded signal, wherein the decoding and transmission of the Bank Address signal may take place in the neck region 30 or in the associated shoulder 26c(m).

In summary, generation of a forwarded data clock delay, which also generates the read command to each bank, causes read activations for far-near bank combinations to collide at the neck, as shown in FIGS. 3A and 3B. Generation of a round trip data clock delay, as shown in FIG. 4A, causes write activations for subsequent far bank and near bank combinations to have data latching problems, as shown in FIG. 4B. The present invention provides a distributed clock delay, as shown in FIG. 6A, which eliminates data collisions for read operations and latching problems for write operations by not generating data clock pulses during the t1 and t2 margins, as shown in FIGS. 6B, 6C.

What has been described herein is merely illustrative of the application of the principles of the present invention. For example, the systems described above and implemented as the best mode for operating the present invention are for illustration purposes only. As a particular example, for instance, other design configurations may be used for read operations, which provide similar operation as the system described herein, in reverse order. In other words, other arrangements and methods may be implemented by those skilled in the art without departing from the scope and spirit of this invention.

What is claimed is:

1. A data clock system for a semiconductor memory system having a plurality of data banks configured for storing data, the plurality of data banks in operative communication with a plurality of first data paths, each first data path in operative communication with a second data path, the data clock system comprising:
   a first clock path receiving a clock signal during a data transfer operation for transferring data between one data bank of the plurality of data banks and the second data path via one of the plurality of first data paths; and
   a second clock path receiving the clock signal from the first clock path and propagating the clock signal along therethrough, the second clock path including at least one clock driver;
   wherein transfer of the data between the one of the plurality of first data paths and the second data path occurs upon receipt of the clock signal by the at least one clock driver.

2. The clock system of claim 1, wherein the second clock path has a near end and a far end, wherein the clock signal is delayed during propagation along the first clock path and the second clock path, wherein the clock signal is delayed by approximately the same amount of time regardless if the at least one clock driver is positioned proximate the far end of the second clock path or the at least one clock driver is positioned proximate the near end of the second clock path.

3. The clock system of claim 1, wherein the first clock path includes at least one clock driver.

4. The clock system of claim 1, wherein the second clock path receives the clock signal from the first clock path at an intermediate point of the second clock path.

5. The clock system of claim 1, wherein each first data path is in operative communication with the second data path via a respective junction circuit, and each clock driver is in operative communication with a corresponding junction circuit;
   wherein upon the clock signal being propagated to the at least one clock driver, the at least one clock driver provides a control signal to the corresponding junction circuit, wherein the corresponding junction circuit is the respective junction circuit corresponding with the one of the plurality of first data paths; and
   wherein the control signal allows the corresponding junction circuit to transfer data between the second data path and the one of the plurality of first data paths.

6. The clock system of claim 5, wherein each of the plurality of first data paths and the second data path include a plurality of data lines, and wherein at least one data switch selectively couples a respective data line of the plurality of data lines of a first data path to a corresponding data line of the plurality of data lines of the second data path, and wherein the coupling is controlled by the control signal.

7. The data clock system of claim 1, wherein the clock system further comprises:
   a first arm clock path receiving the clock signal from the at least one clock driver; and
   a second arm clock path receiving the clock signal from the first arm clock path and propagating the clock signal along therethrough, the second arm clock path including at least one arm clock driver;
   wherein the data is transferred between the one of the plurality of data banks and one of the plurality of first data paths upon receipt of the clock signal by the at least one arm clock driver.

8. A method for propagating a clock signal in a semiconductor memory system having a plurality of data banks configured for storing data, the plurality of data banks in operative communication with a plurality of first data paths, each first data path in operative communication with a second data path, the method comprising the steps of:
   receiving the clock signal in a first clock path during a data transfer operation for transferring data between one data bank of the plurality of data banks and the second data path via one of the plurality of first data paths;
   receiving the clock signal in a second clock path;
   propagating the clock signal along the second clock path via at least one clock driver; and
   transferring the data between one of the first data paths and the second data path upon receipt of the clock signal by the at least one clock driver.

9. The method of claim 8, wherein each first data path is in operative communication with the second data path via a respective junction circuit, and each clock driver is in operative communication with a corresponding junction circuit; the method further comprising the steps of:
   providing a control signal to the corresponding junction circuit upon the clock signal being propagated to the at least one clock driver, wherein the corresponding junction circuit is the respective junction circuit corresponding with the one of the plurality of first data paths; and controlling transferring of the data via the control signal.

10. The method of claim 8, wherein the step of receiving the clock signal in the second clock path further includes receiving the clock signal from the first clock path at an intermediate point of the second clock path.

11. The method of claim 8, wherein the second clock path has a near end and a far end, further including the step of delaying the clock signal by a clock delay during propagation of the clock signal along the first clock path and the second clock path until arriving at the associated clock driver, wherein the clock delay is approximately the same when the associated clock driver is positioned proximate the far end of the second clock path and when the associated clock driver is positioned proximate the near end of the second clock path.

12. A data clock system for a semiconductor memory system having a plurality of data banks configured for storing data, each data bank of the plurality of data banks in data communication with one of at least one first data path, each first data path in operative communication with a second data path, the data clock system comprising:

means for receiving a clock signal in a first clock path during a data transfer operation for transferring data between one data bank of the plurality of data banks and the second data path via one of the plurality of first data paths;

means for receiving the clock signal in a second clock path;

means for propagating the clock signal along the second clock path via at least one clock driver; and means for transferring the data between one of the first data paths and the second data path upon receipt of the clock signal by the at least one clock driver.

13. The data clock system of claim 12, wherein each first data path is in operative communication with the second data path via a respective junction circuit, and each clock driver is in operative communication with a corresponding junction circuit; the data clock system further comprising:

means for providing a control signal to the corresponding junction circuit upon the clock signal being propagated to the at least one clock driver, wherein the corresponding junction circuit is the respective junction circuit corresponding with the one of the plurality of first data paths; and means for controlling transferring of the data via the control signal.

14. The data clock system of claim 12, wherein the second clock path has a near end and a far end, wherein the clock signal is delayed during propagation along the first clock path and the second clock path, wherein the clock signal is delayed by approximately the same amount of time regardless if the at least one clock driver is positioned proximate the far end of the second clock path or the at least one clock driver is positioned proximate the near end of the second clock path.

15. The data clock system of claim 12, wherein the clock system further comprises:

means for receiving the clock signal from the at least one clock driver in a first arm clock path;

means for receiving the clock signal from the first arm clock path in a second arm clock path and propagating the clock signal along therethrough, the second arm clock path including at least one arm clock driver; and means for transferring the data between the one of the plurality of data banks and one of the plurality of first data paths upon receipt of the clock signal by the at least one arm clock driver.

16. A data clock system for a semiconductor memory system having at least one data path, the data clock system comprising:

a first clock path receiving a clock signal during a data transfer operation for transferring data to or from the at least one data path; and a second clock path receiving the clock signal from the first clock path and propagating the clock signal along therethrough, the second clock path including at least one clock driver;

wherein transfer of the data to or from the at least one data path occurs upon receipt of the clock signal by the at least one clock driver.

17. A method for propagating a clock signal in a semiconductor memory system having at least one data path, the method comprising the steps of:

receiving the clock signal in a first clock path during a data transfer operation for transferring data to or from the at least one data path;

receiving the clock signal from the first clock path in a second clock path;

propagating the clock signal along the second clock path via at least one clock driver; and transferring data to or from the data path in accordance with the data transfer operation, upon receipt of the clock signal by the at least one clock driver.

18. A data clock system for a semiconductor memory system having at least one data path, the data clock system comprising:

means for receiving a clock signal in a first clock path during a data transfer operation for transferring data to or from the at least one data path;

means for receiving the clock signal from the first clock path in a second clock path;

means for propagating the clock signal along the second clock path via at least one clock driver; and means for transferring data to or from the data path in accordance with the data transfer operation, upon receipt of the clock signal by the at least one clock driver.

\* \* \* \* \*